May 9, 1967 M. J. HELLSTROM 3,319,174

COMPLEMENTARY BRIDGE INTEGRATED
SEMICONDUCTOR AMPLIFIER
Filed Oct. 7, 1964

INVENTOR
Melbourne J. Hellstrom
BY
Gordon H Telfer
ATTORNEY 3,319,174

COMPLEMENTARY BRIDGE INTEGRATED SEMICONDUCTOR AMPLIFIER

Melbourne J. Hellstrom, Severna Park, Md., assignor to Westinghouse Electric Corporation, Pittsburgh, Pa., a corporation of Pennsylvania Filed Oct. 7, 1964, Ser. No. 402,196
5 Claims. (Cl. 330—17)

Figure 1:
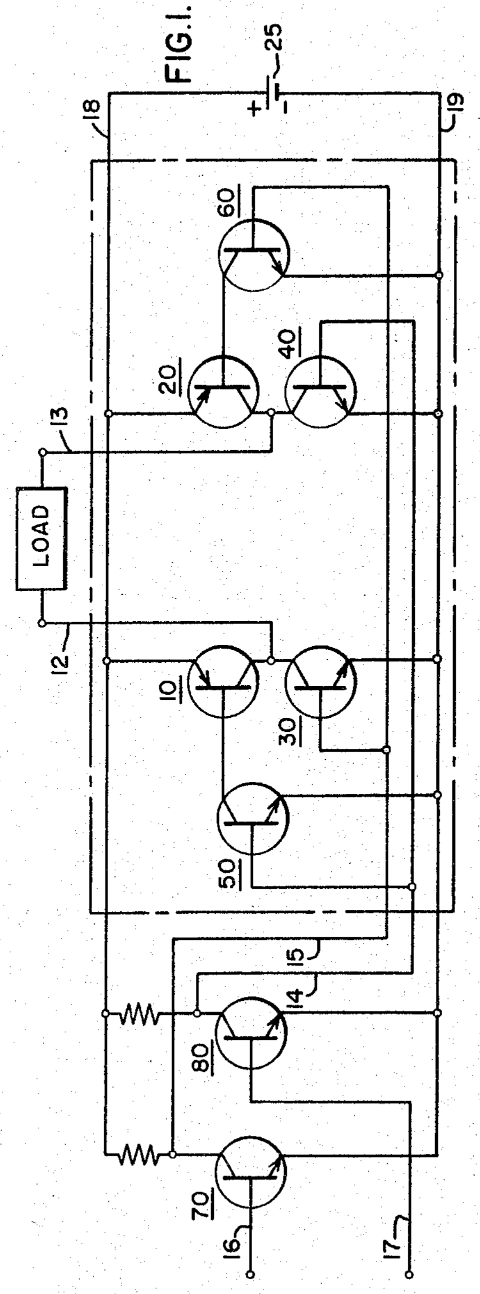

This invention relates generally to semiconductor amplifiers that may be integrated within a unitary body of semiconductive material and, more particularly, to an integrated semiconductor amplifier which is suitable for use in hearing aids.

In semiconductor integrated circuitry wherein the functions of a plurality of individual, conventionally interconnected, components are provided within a unitary body of semiconductive material, amplifiers have been successfully designed for various purposes. However, in the design of an integrated hearing aid amplifier several unique problems arise. The battery voltage available to supply the amplifier is low, typically 1.1 to 1.55 volts. This low voltage is approximately equal to or slightly greater than, twice the emitter-base voltage drop of a silicon transistor operating in its normal condition, i.e, with the emitter-base junction forward biased and collector-base junction reverse biased.

Another requirement is that the current drain from the battery while idling, that is when there is no input signal, should be minimized. The efficiency with signal should also be high. By efficiency is meant the ratio of the average power delivered to the load to the average power supplied by the battery. The use of discrete components such as transformers, large capacitors and center tapped transducers is undesirable since small size is important in hearing aids and they represents additional expense.

Difficulties in fabricating PNP and NPN transistors with matched, high quality characteristics in a single chip also must be considered.

It is, therefore, an object of the present invention to provide an improved semiconductor amplifier that may be readily integrated and is particularly suitable for use in hearing aids.

Another object is to provide an integrated hearing aid amplifier satisfactorily operable with low battery voltage, providing low current drain during idling, reasonable efficiency and not requiring center tapped transducers, transformers and capacitors.

Another object is to provide an integrated hearing aid amplifier having an output stage that may be directly connected with a load.

The invention, in brief, achieves the above-mentioned and additional objects and advantages by providing a semiconductor amplifier having on output amplifier stage that includes a pair of PNP transistors and a pair of NPN transistors in a complementary bridge configuration with output leads connected between each complementary pair of transistors and supply leads are connected between each like pair of transistors. An additional pair of NPN transistors are also provided, each in cascade relationship with one of the PNP transistors to provide increased gain in the PNP portion of the complementary bridge. By cascade relationship between two transistors is meant that the output signal of a first transistor provides the input signal of a second transistor.

The amplifier as above-described resolves all of the previously discussed problems. The transistors operate near class B so that the idling current in the output stage is small and the average efficiency is high. The low battery voltage is accommodated by the fact that the collector to emitter voltage, commonly called the collector saturation voltage, may be made to be low, e.g., 0.1 to 0.2 volt. Ample voltage, therefore, is still available at the load even with the low battery voltage.

The emitters of the like pairs of transistors are connected to the battery terminals. This grounded emitter configuration prevents the necessity of swinging the base voltages outside the range of the battery voltage. Furthermore, no output transformer, nor coupling capacitor, is required for the transducer load which is not center tapped. Such a configuration is suitable as an output stage in an amplifier that may include driver stages of the differential type or other conventional configuration that is readily contained within an integrated circuit. The D.C. levels of the driving bases of the NPN transistors are such that the transistor cross members in the bridge may be driven in parallel.

Figure 2:
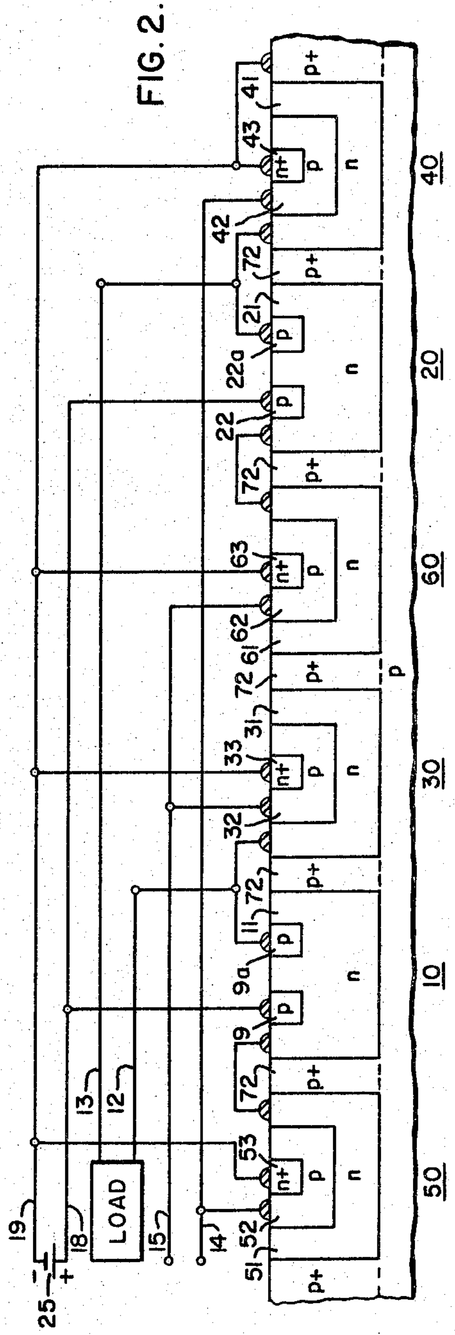

The present invention, together with the above-mentioned and additional objects and advantages thereof will be better understood by reference to the following description taken in connection with the accompanying drawing wherein:

FIGURE 1 is a circuit schematic of a semiconductor amplifier in accordance with the present invention; and FIG. 2 is a partial sectional view of one embodiment of the present invention in a semiconductor integrated circuit.

Referring now to FIGURE 1, there is illustrated a circuit schematic of an amplifier in accordance with the present invention including a pair of PNP transistors 10 and 20 and a pair of NPN transistors 30 and 40 in a complementary bridge configuration. Additional NPN transistors 50 and 60 are connected, respectively, in cascade relation with PNP transistors 10 and 20.

Output leads 12 and 13 are connected, respectively, to the common collectors of transistors 10 and 30 and the common collectors of transistors 20 and 40 for connection with a load that is an output transducer that may be of conventional hearing aid type.

Input leads 14 and 15 are connected, respectively, to the common bases of transistors 40 and 50 and to the common bases of transistors 30 and 60. The input leads 14 and 15 are connected to a prior amplifier stage, here illustrated as conventional amplifiers operating out of phase comprising transistors 70 and 80 which in turn are connected by leads 16 and 17 either to still prior amplifier stages or to an input transducer. It will be recognized that the amplifier stages comprised of the transistors 70 and 80 are merely exemplary of types of prior amplifier stages that may be employed with the output amplifier stage in accordance with this invention. For example, a conventional differential amplifier stage could serve as an alternate for driving the output stage.

Leads 18 and 19 are connected, respectively, to the common emitters of transistors 10 and 20 and to the common emitters of transistors 30, 40, 50 and 60 and serve as power supply leads connected to a battery 25.

The NPN transistors 50 and 60 serve as amplifier stages whose output is inverted by the PNP transistors 10 and 20. In accordance with present integrated circuit technology it is difficult to incorporate matched complementary pairs of transistors having high and nearly equal gain. However, in accordance with the teachings of copending application Ser. No. 284,611, filed May 31, 1963, by H. C. Lin, now Patent 3,197,710, issued July 27, 1965, NPN and PNP transistors may be integrated in the same structure wherein the PNP transistors have low gain, beta, typically in the range from 0.5 to 10 and have a lateral type of configuration formed by simultaneously diffusing the P-type emitter and collector regions into the N-type base region. For further information with respect to such transistors reference should be made to the referred copending application. The combinations of transistors 50 and 10 and transistors 60 and 20 produce gains which are on the same order of magnitude but not necessarily equal to the gains of transistors 30 and 40.

In the circuit in accordance with this invention, matching between the complementary pairs of transistors 10–30 and 20–40 is not essential. It is the case, however, that for good performance all arms of the complementary bridge should have good gain as the overall gain is determined by that of the lowest gain arm. It is also the case that corresponding transistors of like polarity 10–20, 30–40 and 50–60 should have closely matched characteristics so that under signal conditions the distortion is low. These objectives are readily achieved in accordance with present integrated circuit technology.

With the low battery voltage available in hearing aid circuits, the grounded emitter configuration of this invention is particularly desirable to prevent the necessity of swinging the base voltages of the transistor outside the range of the battery voltage. This necessity would arise, for example, if the bridge were constructed of all NPN transistors with the collectors of the upper pair connected to the positive battery terminal and the emitters of the upper pair connected to the collectors of the lower pair of NPN's. In order to obtain the maximum voltage swing across the load it would be necessary to drive the bases of the upper NPN's to a potential higher than the positive battery potential.

Also particularly desirable is the fact that the load may be directly coupled, without any coupling capacitor or output transformer, to the output amplifier and that the load is not required to be center tapped and there will be no average current in the load.

It will be noted that cross members of the bridge, transistor combination 10 and 50 and transistor 40, and transistor combination 20 and 60 and transistor 30 are driven in parallel. Thus, no more than two driving terminals 14 and 15 are necessary even though the bridge uses four transistors, 10, 20, 30 and 40.

In operation the bridge transistors 10, 20, 30 and 40 are biased near cutoff. Cross members of the bridge are driven in phase, that is, transistors 10 and 40 are driven on while transistors 20 and 30 are driven off. Thus, current can reverse through the load and the average current in the load will be nearly zero. For no signal and reasonably well-matched characteristics between the transistors 10 and 20 and the transistors 30 and 40, there will be no current in the load.

The peak voltage available for the load is the battery voltage (E) reduced by the sum of the saturation voltage drops of one NPN transistor and one PNP transistor. If the saturation voltage drops ($V_s$) are equal, then the peak output voltage ($V_p$) is:

$$V_p = E - 2V_s$$

The average sine wave power ($P_{avg}$) delivered to a load resistance, $R_L$, is then $$P_{avg} = \tfrac{1}{2}(V_p)^2/R_L = \tfrac{1}{2}(E - 2V_s)^2/R_L$$

This bridge arrangement delivers the maximum possible voltage swing to the load. Hence, for a given output power, it requires the least peak current thus permitting greater flexibility in the design of the transistors. At the same time lower peak current means lower saturation voltage drop and therefore higher output power and efficiency.

Referring to FIGURE 2 there is shown a representative integrated form of the portion of the circuit of FIGURE 1 enclosed by the dashed line including the transistors 10, 20, 30, 40, 50 and 60. It will be understood that considerably more elements may be integrated in the same structure at least to the extent that all amplifier stages are included. The external interconnections between various regions in FIGURE 2 are merely by way of illustration. It should be realized that in actual integrated circuits the conductive interconnections are conveniently disposed on the surface of the semiconductive body and insulated therefrom by an insulating layer such as silicon dioxide. Reference numerals are the same where indicating elements corresponding to those of FIG. 1. The NPN transistors 30, 40, 50 and 60 include N-type regions 31, 41, 51 and 61, respectively, that are isolated from each other and have diffused therein P-type regions 32, 42, 52 and 62, respectively, and N-type regions 33, 43, 53 and 63, respectively. The isolated N-type regions 31, 41, 51 and 61 serve as collectors in the NPN transistors, the P-type regions 32, 42, 52 and 62 serve as bases and the diffused N-type regions 33, 43, 53 and 63 serve as emitters.

The PNP transistors 10 and 20 are lateral transistors as described in the aforementioned copending application. The structure includes isolated N-type regions 11 and 21 that are like regions 31, 41, 51 and 61 in the NPN transistors. The regions 11 and 21 serve as base regions in the PNP transistors. In each N-type region 11 and 21 there are two diffused P-type regions. P-type regions 9 and **9*a* are in N-type region 11 and serve, respectively, as emitter and collector regions of transistor 10. P-type regions 22 and 22*a* are in N-type region 21 and serve, respectively, as emitter and collector regions on transistor 20**. An ohmic contact is disposed on each of the base, emitter and collector regions of each of the transistors.

In the fabrication of an integrated circuit as shown in FIGURE 2 the starting material may be of a body of P-type monocrystalline silicon. One or more layers of N-type epitaxial material are disposed on a surface of the substrate, such surface preferably being near <111> orientation. The epitaxial layers are then separated into distinct regions 11, 21, 31, 41, 51 and 61 by diffusion of a P+ wall 72 for isolation. Then, in successive diffusion operations, the P-type regions 9, **9*a*, 22, 22*a*, 32, 42, 52 and 62 and N+ regions 33, 43, 53 and 63** are formed in the transistor areas. It will be understood that each of the diffusion operations may be performed using conventional oxide masking and photo-resist techniques for example, using boron for the P-type doping impurity and phosphorus for the N-type doping impurity. Formation of ohmic contacts and conductive interconnections, lead attachment and encapsulation may be conventionally performed. Additional information useful in the fabrication of integrated structures as illustrated in FIG. 2 may be had by referring to the before-mentioned copending application.

Merely as an example, the surface concentration of the P-type isolation wall 72 may be about $10^{20}$ atoms per cubic centimeter. The surface concentration of the P-type regions 9, **9*a*, 22, 22*a*, 32, 42, 52 and 62 in the transistor structure may be about $10^{18}$ atoms per cubic centimeters with a depth of about 0.12 to 0.16 mil. A typical thickness for the epitaxial layer or layers making up the regions 11, 21, 31, 41, 51 and 61 is about 0.4 mil. A typical surface concentration for the N+ emitter regions 33, 43, 53 and 63** is about $10^{21}$ atoms per cubic centimeter with a diffused depth of about 0.08 to 0.109 mil. The starting material of P-type silicon may have a resistivity of about 20 ohm-centimeters and have a thickness of about 8 mils.

It will be appreciated that the foregoing description is merely exemplary of the fabrication of an integrated circuit in accordance with this invention and that as to specific processes, materials, and geometrical configurations employed considerable variation may be achieved within the scope of this invention. For example, the semiconductivity type of all of the regions may be reversed from that shown with a corresponding reversal of polarity in the circuit.

While the description herein has been with respect to integrated circuits with diffused isolation walls of semiconductive material between elements, the invention may be embodied in other forms of integrated circuits including that wherein isolation between elements is provided by insulating material such as silicon dioxide as described, for example, in Electronics, vol. 37, No. 17, p. 23 (June 1, 1964). Reference herein to a unitary body of semiconductive material, or the like, is intended to include such structures.

It should also be noted that in its broader aspects this invention is applicable to amplifiers for uses other than in hearing aids and that the invention may be practiced in other than unitary structures such as by the use of multiple semiconductor wafers in the same or even in different packages. However, while the circuit may be comprised of discrete components that are conventionally interconnected, it is not considered economically advantageous to do so and matching of the like polarity transistors 10–20, 30–40 and 50–60 is difficult.

While the present invention has been shown and described in few forms only it will be apparent that various other changes and modifications may be made without departing from the spirit and scope thereof.

What is claimed is:

1. A semiconductor amplifier comprising:

first and second transistors of a first polarity having their emitters connected together with a first supply lead connected thereto;

third and fourth transistors of a second polarity having their emitters connected together with a second supply lead connected thereto;

said first and third transistors having their collectors connected together with a first output lead connected thereto;

said second and fourth transistors having their collectors connected together with a second output lead connected thereto;

fifth and sixth transistors of said second polarity having their emitters both connected to the emitters of said third and fourth transistors;

said fifth transistor having its collector connected to the base of said first transistor;

said sixth transistor having its collector connected to the base of said second transistor;

said third and sixth transistors having their bases connected together with a first input signal lead connected thereto;

said fourth and fifth transistors having their bases connected together with a second input signal lead connected thereto.

2. A semiconductor amplifier in accordance with claim 1 wherein: an output transducer for conversion of electrical signals to sound is connected directly to said output leads and a supply battery is connected to said supply leads.

3. A semiconductor integrated amplifier comprising: a unitary body of semiconductive material including therein two transistors of a first polarity and four transistors of a second polarity, each transistor having an emitter, a base and a collector; first means conductively interconnecting the collectors of a first transistor of first polarity and a first transistor of second polarity; second means conductively interconnecting the collectors of a second transistor of first polarity and a second transistor of second polarity; third means conductively interconnecting the collector of a third transistor of second polarity and the base of said first transistor of first polarity; fourth means conductively interconnecting the collector of a fourth transistor of second polarity and the base of said second transistor of first polarity; fifth means conductively interconnecting the emitters of said first and second transistors of first polarity; sixth means conductively interconnecting the emitters of said first, second, third and fourth transistors of second polarity; seventh means conductively interconnecting the bases of said second and third transistors of said second polarity; and eighth means conductively interconnecting the bases of said first and fourth transistors of said second polarity.

4. A semiconductor integrated amplifier in accordance with claim 3 further comprising: a source of input signals connected to said seventh and eighth means; a load connected to said first and second means; and a supply battery connected to said fifth and sixth means.

5. A semiconductor integrated amplifier in accordance with claim 3 wherein: said first, second, third and fourth transistors of said second polarity comprise successive layers of semiconductive material of alternate semiconductivity type with the collectors thereof being of material penetrating deepest within said unitary body; and said first and second transistors of said first polarity comprise bases of material disposed like that of said collectors of said transistors of second polarity and emitters and collectors of opposite semiconductivity type to said bases laterally disposed therein.

References Cited by the Examiner

UNITED STATES PATENTS

| | | | |
|---|---|---|---|
| 2,821,639 | 1/1958 | Bright et al. | |
| 2,994,834 | 8/1961 | Jones. | |
| 3,078,379 | 2/1963 | Plogstedt et al. | |
| 3,175,211 | 3/1965 | Lee et al. | |
| 3,212,019 | 10/1965 | Schwartz | 330—17 X |
| 3,229,217 | 1/1966 | Van Zeeland | 330—18 |
| 3,255,418 | 6/1966 | Dufendach et al. | 330—30 X |

ROY LAKE, *Primary Examiner.*

F. D. PARIS, J. B. MULLINS, *Assistant Examiners.*